(12) United States Patent
Loo et al.

(10) Patent No.: US 8,093,098 B2
(45) Date of Patent: Jan. 10, 2012

(54) POST-PROCESSING TREATMENT OF CONDUCTIVE POLYMERS TO ENHANCE ELECTRICAL CONDUCTIVITY

(75) Inventors: Yueh-Lin Loo, Princeton, NJ (US); Joung Eun Yoo, Plainsboro, NJ (US); Kwang Seok Lee, Hillsboro, OR (US)

(73) Assignees: The Trustees of Princeton University, Princeton, NJ (US); The Board of Regents, the University of Texas System, Austin, TX (US)

( * ) Notice: Subject to any disclaimer, the term of this patent is extended or adjusted under 35 U.S.C. 154(b) by 184 days.

(21) Appl. No.: 12/574,677

(22) Filed: Oct. 6, 2009

(65) Prior Publication Data
US 2010/0112750 A1  May 6, 2010

Related U.S. Application Data

(60) Provisional application No. 61/102,903, filed on Oct. 6, 2008.

(51) Int. Cl.
*H01L 51/40* (2006.01)
*H01L 21/00* (2006.01)

(52) U.S. Cl. .......... 438/99; 438/158; 257/E51.003; 257/E51.005

(58) Field of Classification Search .......... 438/99, 438/158; 257/E51.003, E51.005
See application file for complete search history.

(56) References Cited

U.S. PATENT DOCUMENTS

| | | | | |
|---|---|---|---|---|
| 3,754,986 | A | * | 8/1973 | Perez-Albuerne .......... 430/75 |
| 5,205,965 | A | * | 4/1993 | Uetani et al. .......... 252/500 |
| 5,324,815 | A | * | 6/1994 | Ohtani et al. .......... 528/422 |
| 6,203,727 | B1 | * | 3/2001 | Babinec et al. .......... 252/500 |
| 2005/0186699 | A1 | * | 8/2005 | Kawase et al. .......... 438/99 |

OTHER PUBLICATIONS

Yoo, Joung Eun et al "Improving the electrical conductivity of polymer acid-doped polyaniline by controlling the template molecular weight", Journal of Materials Chemistry, 2007, 17, 1268-1275.

Adams, P.N. et al "Conductivity measurements of novel, oriented polyaniline films", Synthetic Metals 101 (1999) 776-777.

Kim, J.Y. et al "Enhancement of electrical conductivity of poly (3,4-ethylenedioxythiophene)/poly(4-styrenesulfonate) by a change of solvents", Synthetic Metals 126 (2002) 311-316.

Lee, Kwang Seok "Water-dispersible, conductive polyaniline for organic thin-film electronics" Dissertation, Presented to the University of Texas at Austin, Dec. 2007.

Mukherjee, A. K. et al "The Role of Molecular Recognition in Charge Transport Properties of Doped Polyaniline", Applied Biochemistry and Biotechnology, vol. 96, 2001, 145-153.

(Continued)

*Primary Examiner* — Kevin M Picardat
*Assistant Examiner* — Neil Prasad
(74) *Attorney, Agent, or Firm* — Meagher Emanuel Laks Roehling & Goldberg, LLP; Daniel S. Goldberg

(57) ABSTRACT

A method for enhancing electrical conductivity of a film which includes at least one conductive polymer. The method includes providing the film comprising the at least one conductive polymer and at least one polymer acid, agitating the film in at least one reagent; and, placing the film on a heated surface. The at least one reagent includes a reagent acid that is stronger than the polymer acid. The conductivity of the treated film is significantly greater than the conductivity of the untreated film.

20 Claims, 10 Drawing Sheets

OTHER PUBLICATIONS

Ouyang, J., et al On the mechanism of conductivity enhancement in poly(3,4-ethylenedioxythiophene): poly(styrene sulfonate) film through solvent treatment, Polymer 45 (2004) 8443-8450.

Loo, Yueh-Lin (Lynn) "Solution-Processable Organic Conductors and Semiconductors: Viable Materials for Thin-film Electronics", Slides presented to Chemical & Biomolecular Engineering Department, North Carolina State University, Sep. 24, 2007.

Yoo, Joung Eun et al "Polymer Conductivity through Particle Connectivity", Chem. Mater. 2009, 1948-1954, supporting information attached, 1-10.

Yoo, Joung Eun et al "Narrowing the size distribution of the polymer acid improves PANI conductivity", Journal of Materials Chemistry, 2008, 18, 3129-3135, May 12, 2008.

Loo, Yueh-Lin (Lynn) "Controlling Structural Complexities through Solution Processing: Applications in Organic Thin-film Electronics", Slides presented to Chemical Engineering Colloquium, University of California, Berkeley, Oct. 8, 2008.

Zhou, J. "Electrically conductive PANi multifilaments spun by a wet-spinning process", 2001 Kluwer Academic Publishers, 3089-3095.

* cited by examiner

|  | dca-treated | untreated |
|---|---|---|
| Eff. (%) | 0.26+/-0.01 | 0.1+/-0.0 |
| VOC | 0.31+/-0.01 | 0.32+/-0.02 |
| ISC | 2.43+/-0.18 | 0.9+/-0.05 |
| FF | 0.34+/-0.02 | 0.36+/-0.01 |

POST-PROCESSING TREATMENT OF CONDUCTIVE POLYMERS TO ENHANCE ELECTRICAL CONDUCTIVITY

This application is based upon and claims the benefit of priority from U.S. Provisional Patent Application No. 61/102,903, titled "Dichoroacetic Acid Treatment of Conductive Polymers to Enhance Electrical Conductivity" filed on Oct. 6, 2008, the entire contents of which are incorporated herein by reference.

Large-area displays based on organic materials, for example, conductive polymers, promise low-cost fabrication, lightweight construction, mechanical flexibility and durability. Conductive polymers have been used as electrodes in organic electronic devices, such as organic thin-film transistors, solar cells, and organic light emitting diodes.

To realize low-cost aspects of organic electronics solution processing methodologies such as inkjet printing or spin casting have been proposed. This need has in turn driven the development of solution-processable organic semiconductors, and solution processable organic conductors.

Electronic devices made from spun-cast organic semiconductors have previously been disappointing because their carrier mobilities (<10-3 cm$^2$/V-sec) are too low for any practical applications, and their current-voltage characteristics are highly dependent on the processing conditions. There is, thus, a need to provide low cost organic based semiconductors with characteristics, such as electric conductivity, that are suitable for practical applications in electronic devices including solar cells.

In accordance with the present disclosure, there is provided a method for enhancing electrical conductivity of a film, the method comprising: providing a film comprising at least one conductive polymer and at least one polymer acid; agitating the film in at least one reagent; and placing the film on a heated surface, wherein the at least one reagent comprises a reagent acid that is stronger than the polymer acid, and further wherein the conductivity, measured in S/cm, of the treated film is significantly greater than the conductivity of the untreated film.

There is also provided in accordance with the present disclosure a method for enhancing electrical conductivity of a film, the method comprising: providing a film comprising at least one conductive polymer and at least one polymer acid; agitating the film in at least one reagent; and placing the film on a heated surface, wherein the at least one reagent comprises a reagent acid that is stronger than the polymer acid, and further wherein the conductivity, measured in S/cm, of the treated film is at least 100 times greater than the conductivity of the untreated film.

In a further embodiment in accordance with the present disclosure, there is provided a method for enhancing carrier mobility of an electrode in an organic device, the method comprising: providing a film comprising at least one conductive polymer and at least one polymer acid; agitating the film in at least one reagent; placing the film on a heated surface; and forming the electrode, wherein the at least one reagent comprises a reagent acid that is stronger than the polymer acid, and wherein the carrier mobility, measured in cm$^2$/V-sec, of the device comprising the electrode comprising the treated film is at least 10 times greater than the carrier mobility of a device comprising an electrode comprising the untreated film. In certain embodiments, the electrode is made from the treated conductive polymer film, and in other embodiments, the electrode is formed by bringing the treated conductive polymer film into contact with a substrate.

In an additional embodiment in accordance with the present disclosure, there is provided a method for enhancing the on/off current ratio of an organic electronic device, the method comprising: providing a film comprising at least one conductive polymer and at least one polymer acid; agitating the film in at least one reagent; placing the film on a heated surface; and forming the organic electronic device, wherein the at least one reagent comprises a reagent acid that is stronger than the polymer acid, and wherein the on/off current ratio of the device comprising the treated film is at least 100 times greater than the on/off current ratio of a device comprising the untreated film.

In yet another embodiment in accordance with the present disclosure, there is provided a treated conductive film prepared by a method comprising agitating in at least one reagent a conductive film comprising at least one conductive polymer and at least one polymer acid; and placing the film on a heated surface, wherein the at least one reagent comprises a reagent acid that is stronger than the polymer acid, and further wherein the treated conductive film has a conductivity, measured in S/cm, that is at least 100 times greater than the corresponding property of the untreated conductive film.

A further embodiment in accordance with the present disclosure is directed to an electrode in an organic device prepared by a method comprising: providing a film comprising at least one conductive polymer and at least one polymer acid; agitating the film in at least one reagent; placing the film on a heated surface; and forming the electrode, wherein the at least one reagent comprises a reagent acid that is stronger than the polymer acid, and wherein the carrier mobility, measured in cm$^2$/V-sec, of the device comprising the electrode comprising the treated film is at least 10 times greater than the carrier mobility of a device comprising an electrode comprising the untreated film.

Additionally provided in accordance with the present disclosure is an organic electronic device prepared by a method comprising providing a film comprising: at least one conductive polymer and at least one polymer acid; agitating the film in at least one reagent; placing the film on a heated surface; and forming the organic electronic device, wherein the at least one reagent comprises a reagent acid that is stronger than the polymer acid, and wherein the on/off current ratio of the device comprising the treated film is at least 100 times greater than the on/off current ratio of a device comprising the untreated film.

An electrical device comprising any of the conductive films as described herein is also an embodiment of the present disclosure. Suitable electrical devices include, for example, solar cells, organic thin-film transistors, photodetectors, photovoltaic devices, photoconductors, and organic light emitting diodes.

It is to be understood that both the foregoing general description and the following detailed description are exemplary and explanatory only and are not restrictive of the invention, as claimed.

The accompanying drawings, which are incorporated in and constitute a part of this specification, illustrate embodiments of the invention and, together with the description, serve to explain the principles of the invention.

Reference will now be made in detail to exemplary embodiments of the present disclosure, examples of which are illustrated in the accompanying drawings. Wherever possible, the same reference numbers will be used throughout the drawings to refer to the same or like parts.

In accordance with some embodiments, an organic based film is first prepared by a pre-processing method and is then treated by being subjected to solvent exposure.

Figure 1:
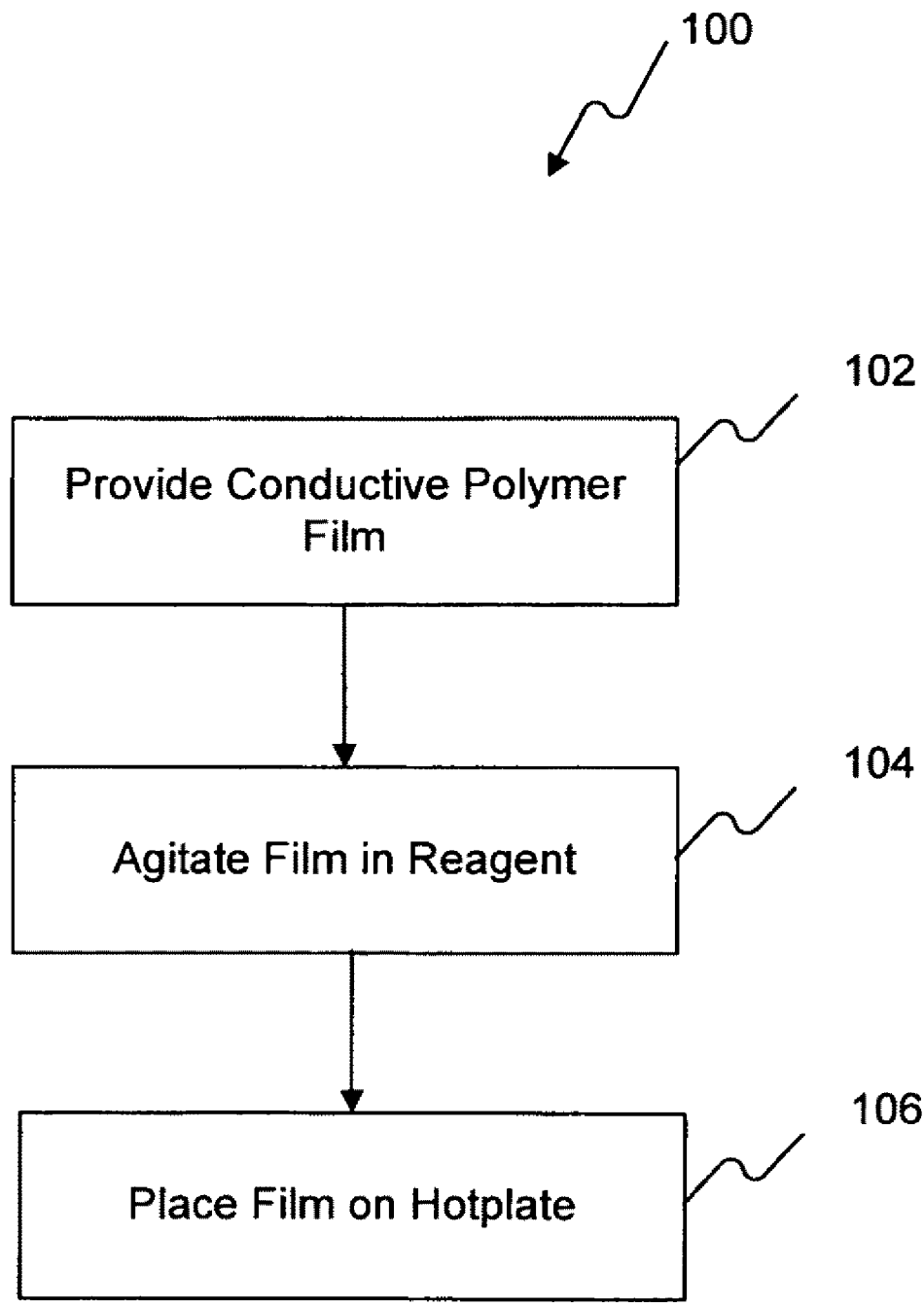
FIG. 1 illustrates a post-processing treatment of the conducting polymer film, in accordance with an embodiment.

FIG. 1 illustrates a post-processing treatment 100, in accordance with an embodiment. In step 102, a conductive polymer film is provided for post-processing treatment and in steps 104 and 106, the conductive polymer film is treated to improve its conductivity. The conductive polymer film can, for example, result from a pre-processing during which a conductive polymer is doped with a polymer acid. In various embodiments, the conductive polymer includes a water dispersible polymer acid such that the conductive polymer can be processed from dispersion.

Suitable conductive polymers include, for example, polyaniline (PANI), poly(ethylene dioxythiophene) (PEDOT) and polypyrrole. Further, the conductive polymer can be doped with a polymer acid. The polymer acid can be, for example, poly(2-acrylamido-2-methyl-1-propanesulfonic acid) (PAAMPSA) or poly(styrene sulfonate) (PSS). In some embodiments, PANI can be prepared by oxidatively polymerizing aniline monomers in the presence of a polymeric acid dopant. In some embodiments, PAAMPSA, can be synthesized via conventional free-radical polymerization and atom transfer radical polymerization. Subsequently, the pre-processing performs aniline polymerization in the presence of PAAMPSA, which yields water dispersible, conductive PANI-PAAMPSA. Other embodiments of the present disclosure utilize a film comprising PEDOT and PSS.

In some embodiments, the pre-processing also includes patterning the prepared conductive polymer film in the form required for a specific electronic device. For example, in some embodiments, the pre-processing includes creating a PANI-PAAMPSA electrode by drop-casting from the PANI-PAAMPSA aqueous dispersion. In some embodiments, a patterning technique, e.g., stamp-and-spin-cast, is used to fabricate bottom-contact thin-film transistors with PANI electrodes.

Generally, solution processable conductive polymers lack the electrical conductivity necessary for a range of applications. In order to increase their conductivity, various embodiments further treat the provided conductive polymer film though steps 104 and 106.

In step 104, the conductive polymer film is exposed to a reagent. Various embodiments select the reagent according to criteria which makes the reagent suitable for the specific type of conductive polymer. For example, in some embodiments, the reagent is selected to include a plasticizer reagent. Further, in some embodiments, the reagent is selected to include an acid which has a higher acidity (e.g., a lower pKa) compared to the polymer acid dopant in the conductive polymer. For example, in some embodiments which use PAAMPSA as the polymer acid dopant, the reagent is selected to include dichloroacetic acid (DCA). In some other embodiments, the reagent is selected to include trichloroacetic acid.

In certain embodiments, in step 104 the conductive polymer film is exposed to the reagent by being immersed into the solution for a time interval sufficient to cause the reagent molecules to diffuse into the conductive polymer film. To facilitate the diffusion in certain embodiments, the reagent solution can be preheated and/or the immersed conductive film is agitated. In certain embodiments, the conductive polymer film can be agitated for several minutes in a DCA solution that was preheated to a temperature ranging from 80° C. to 120° C., such as 90° C.

In step 106, the conductive film is removed from the reagent solution and exposed to heat in order to remove the excess reagent. In some embodiments, step 106 is performed by placing the conductive film on a hotplate. The temperature of the hotplate is selected to be below the glass transition of the polymer acid dopant. Specifically, because the glass transition temperature of PAAMPSA is estimated to be around 180° C., in some embodiments which use PAAMPSA doped conductive polymers, the hotplate temperature is set to about 145° C. On the other hand, because the glass transition temperature of PSS is estimated to be around 110° C., in some embodiments which use PSS doped conductive polymers, the hotplate temperature is set to about 90° C. In some embodiments, the conductive film is placed on the hotplate for a time interval sufficient to remove the extra reagent from the surface. In one embodiment, PANI-PAAMPSA is removed from the reagent solution and is placed for about thirty minutes on a hotplate that is set to a temperature around 145° C.

Post-processing treatment 100 can improve dramatically the electrical characteristics of conductive polymer films and thus the performance characteristics of the devices which employ those conductive polymer films. In certain embodiments, the conductivity of the treated film (measured in S/cm) is increased by more than 25 times compared to the corresponding conductivity of the untreated film, such as an increase of more than 50 times, an increase of more than 75 times, an increase of more than 100 times, an increase of more than 150 times, and an increase of more than 200 times. In additional embodiments, the carrier mobility (measured in $cm^2$/V-sec) of a device comprising an electrode comprising the treated film is at least 5 times greater than the carrier mobility of a device comprising an electrode comprising the untreated film, such as an increase of an increase of more than 8 times, an increase of more than 10 times, an increase of more than 15 times, and an increase of more than 20 times. In further embodiments, the on/off current ratio of a device comprising the treated film is increased by more than 25 times compared to the corresponding on/off current ratio of a device comprising the treated film or a device using an untreated film, such as an increase of more than 50 times, an increase of more than 75 times, an increase of more than 100 times, an increase of more than 150 times, and an increase of more than 200 times.

Additionally, post-processing treatment can improve the characteristics of the device by a large reduction in the threshold voltage and current hysteresis on cycling—observations that imply trap reduction at the electrode-organic semiconductor and dielectric semiconductor interfaces, respectively. The changes in electrical characteristics of the conductive film can be directly correlated with changes in the morphology of the conductive polymer film as shown, for example, in FIGS. 9 and 10.

Figure 2:
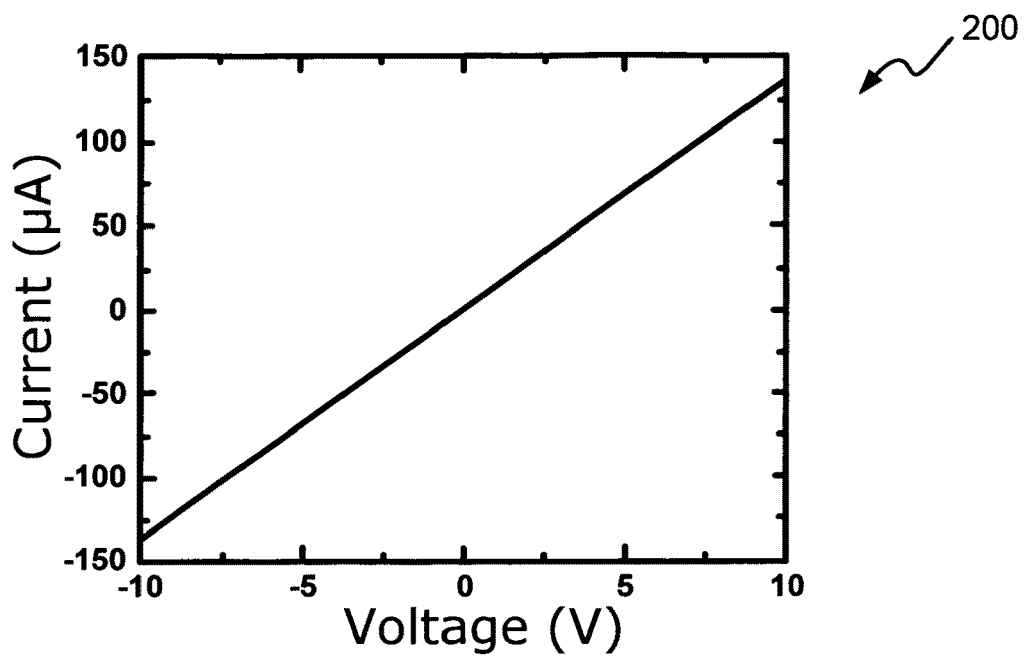
FIG. 2 shows a current/voltage graph for a film before post-processing treatment.
Figure 3:
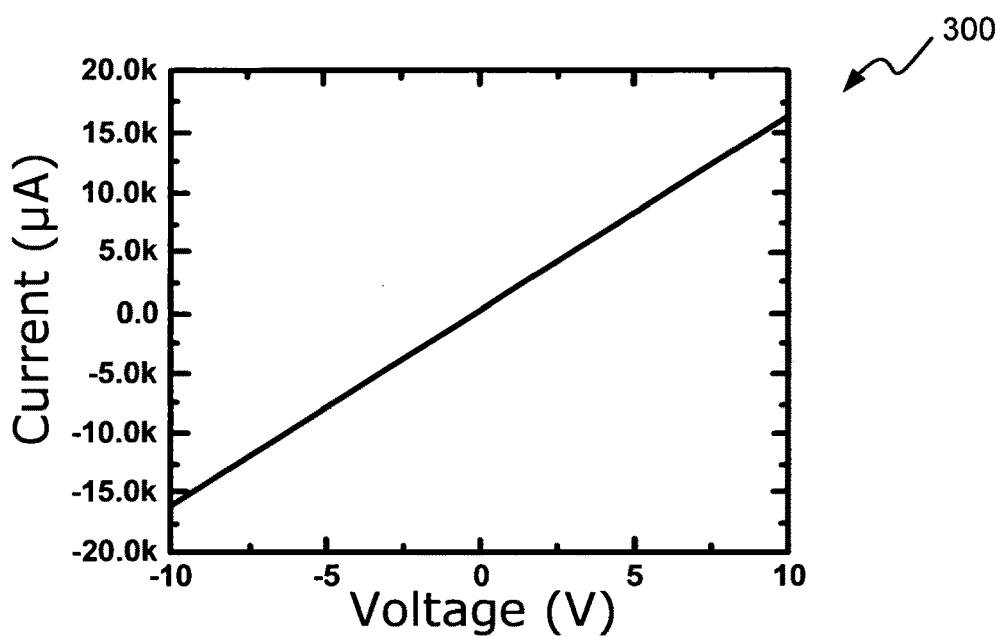
FIG. 3 shows a current/voltage graph of a film after post-processing treatment, in accordance with an embodiment.

FIGS. 2 and 3 show current/voltage graphs 200 and 300 which illustrate the effect of post-processing treatment 100 on the electrical conductance measured for a PANI-PAAMPSA film, in accordance with one embodiment. FIG. 2 corresponds to the film after it was prepared and before post-processing treatment 100, while FIG. 2B corresponds to the same film after post-processing treatment with DCA. To plot each graph, different voltages were applied to a sample film and, for each voltage, a resulting current was measured. The voltage/current measurement was performed using a four-point probe technique In the four-point probe technique four equally-spaced gold strips are deposited directly onto the film through a shadow mask. The resistance is obtained by dividing the applied current by the voltage drop between the two inner gold strips. Contact resistances between the film and the gold strip, as well as those between the probe tip and the gold strip, is thus eliminated. The conductivity is then obtained by normalizing the film resistance by the cross-sectional area defined by the gold strip and the distance between two inner gold strips.

FIG. 2, shows the current/voltage graph 200 for the film before post-processing treatment 100. Graph 200 shows that the current increased linearly from about −130 micro-amperes to about +130 micro-amperes, when the applied voltage changed from −10 volts to +10 volts. These data indicate that, before post-processing treatment 100, the sample had a conductance (measured as the change in current divided by the change in voltage) that is 100× less than the film after treatment.

FIG. 3, on the other hand, shows the current/voltage graph 300 for the same film after post-processing treatment 100. Graph 300 shows that the current increased linearly from about −16 mili-amperes to about +16 mili-amperes, when the applied voltage changed from −10 volts to +10 volts. These data indicate that, after post-processing treatment 100, the sample had reached a conductance which is more than 100 times that of the conductance measured in graph 200. Same amount of increase was shown by finding the conductivities measured via normalizing each conductance by the length and cross-sectional area of the film. These measurements showed that the average conductivity for the sample was 0.16±0.11 S/cm in FIG. 2 and 72.9±44.6 S/cm in FIG. 3.

Figure 9:
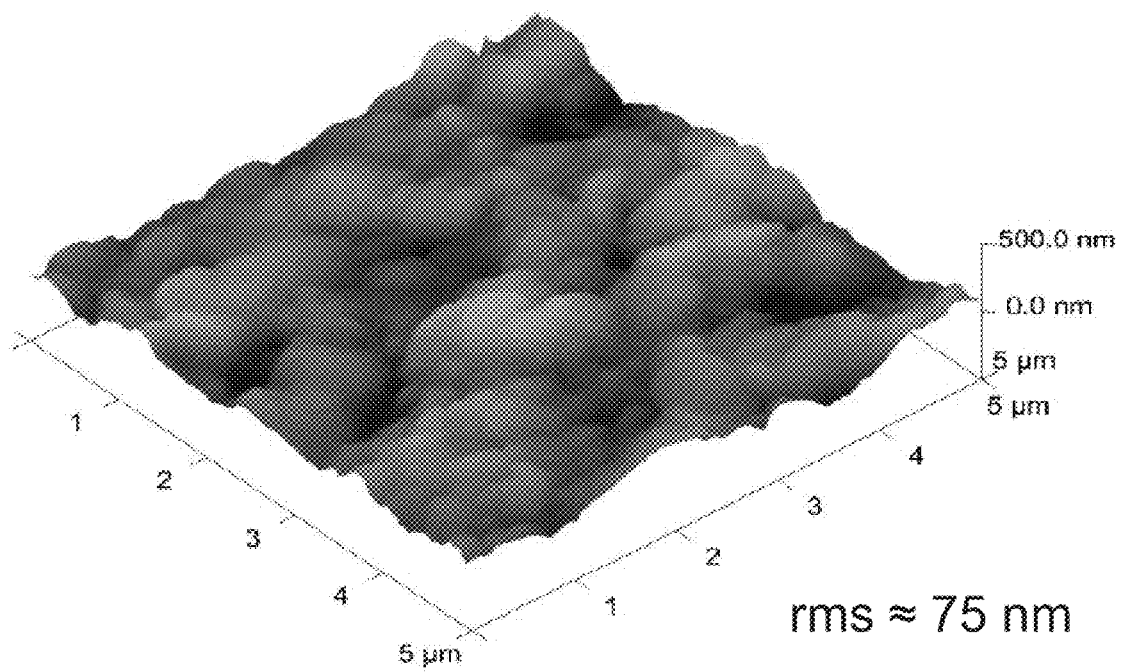
FIG. 9 illustrates the structure of a conductive polymer film before post-processing treatment.
Figure 10:
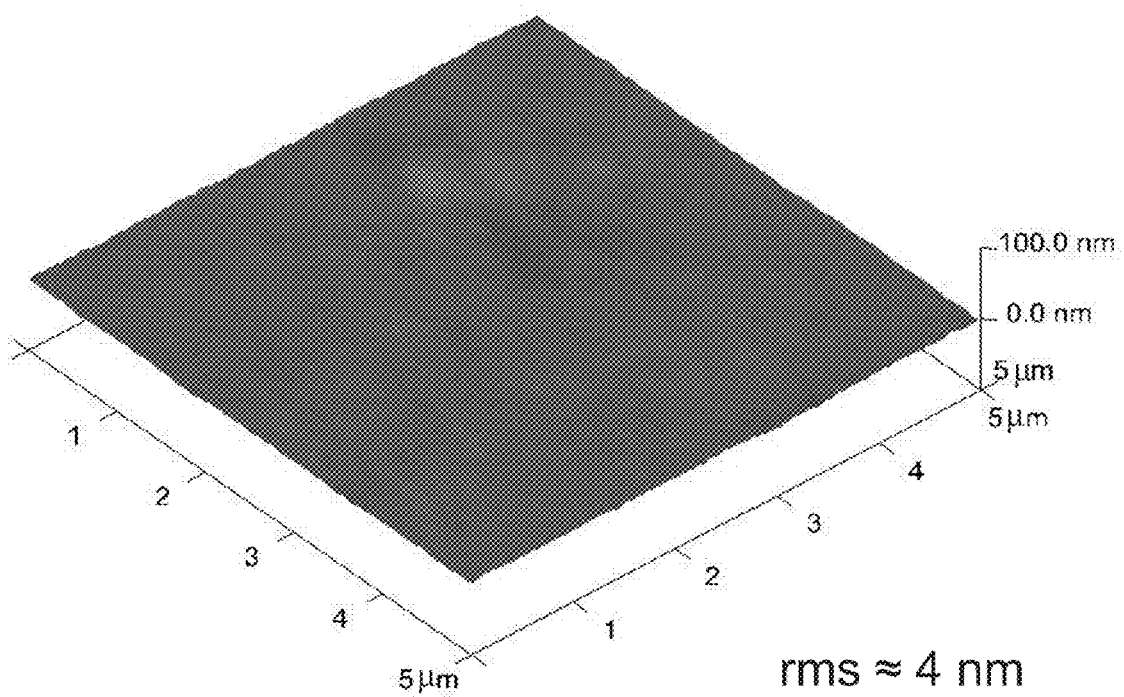
FIG. 10 illustrates the structure of a same conductive polymer film depicted in FIG. 9 after post-processing treatment, in accordance with an embodiment.

Post-processor treatment 100 can achieve the above large change in conductivity by inducing structural rearrangements in the conductive polymer. For example the increase in conductivities observed in FIGS. 2 and 3 is accompanied by pronounced changes in the molecular structure of PANI-PAAMPSA as shown in FIGS. 9 and 10, respectively.

Investigating the interactions between PANI and PAAMPSA has shed some light on understanding the origin of the structural changes. Specifically, there are strong ionic interactions between PANI and PAAMPSA which lead to a compact coil conformation of PANI-PAAMPSA. The reagent, which in certain embodiments can be DCA, effectively interrupts the ionic interactions between PANI and PAAMPSA. Due to moderated ionic interactions, PANI-PAAMPSA can rearrange its conformation from the "compact coil" to the "extended chain". In the extended chain conformation, delocalized polarons and bipolarons that enable more efficient charge transport are increased, thereby improving the conductivity of PANI-PAAMPSA.

Figure 4:
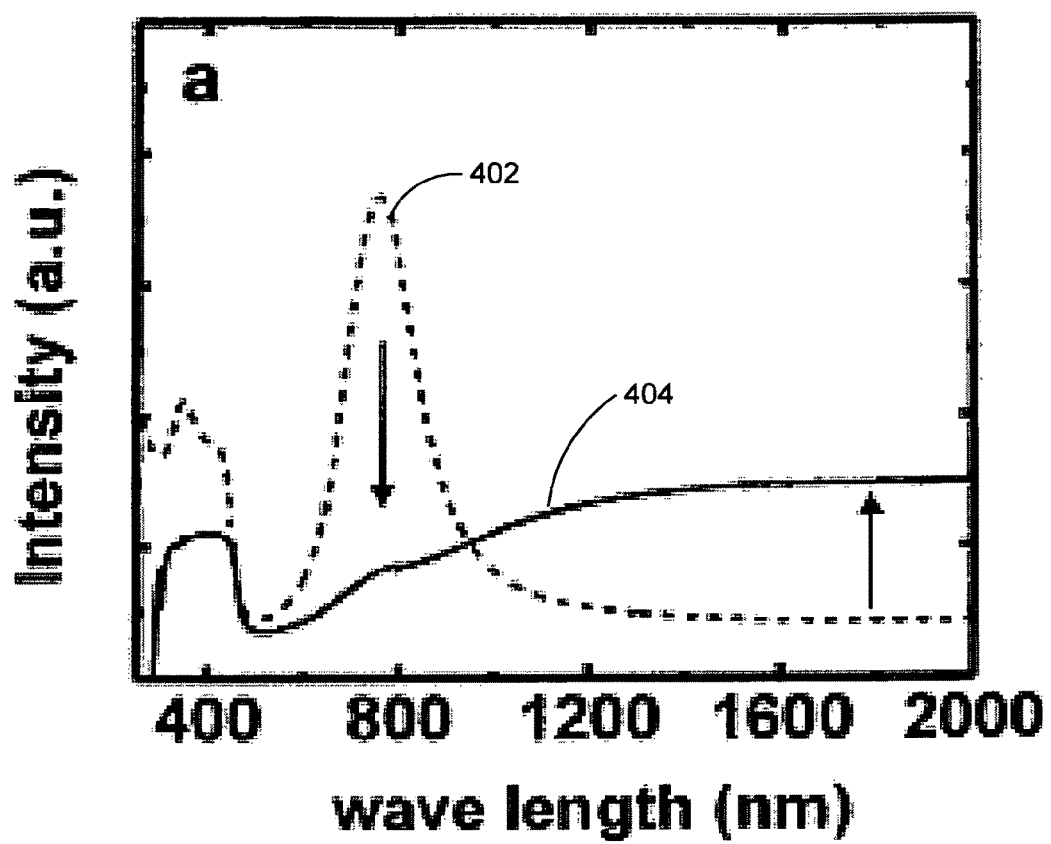
FIG. 4 shows the effect of post-processing treatment on ultraviolet-visible-near-infra-red spectroscopy of a conductive polymer film (402 refers to before treatment and 402 refers to after treatment), according to one embodiment.

In order to understand the effect of the post-processing treatment 100 on the electronic structure of a conductive polymer film, film samples have been studied via spectroscopy. FIG. 4 includes graphs 402 and 404, which respectively show the results of ultraviolet-visible-near-infra-red spectroscopy (UV-Vis-NIR) experiments on a PANI-PAAMPSA film before post-processing treatment (untreated film) and after post-processing treatment with DCA (treated film). Graph 404, showing the UV-Vis-NIR spectrum for the treated film, reveals an absorption pattern that is drastically different from that of graph 402 for the untreated film.

Graph 402, for the untreated film, shows two distinct absorption bands. The broad absorption ranging from 300 nm to 450 nm is associated with a transition from the $\pi$ band to the $\pi^*$ band. The other narrow absorption at around 760 nm is attributed to a transition from the $\pi$ band to a narrow polaron band. This optical spectrum is consistent with previously-reported spectra of PANI having low conductivities (0.01-0.1 S/cm), and is interpreted as PANI having a compact coil conformation. On the other hand, graph 404, for the treated film, does not show the narrow absorption at 760 nm, and instead shows a broad absorption between 1000 and 2000 nm. This broad absorption is often referred to as the "free charge carrier tail," and corresponds to the transition from a broad polaron band to the $\pi^*$ band stemming from an extended chain conformation. The presence of this board absorption in the near-IR region suggests that, as a result of post-processing treatment, the chain conformation of PANI-PAAMPSA probably changes from a compact coil conformation to an extended chain conformation. Such extended chain conformation is believe to improve charge transport. As a consequence, DCA-treated PANI-PAAMPSA exhibits conductivities on the order of 100 S/cm.

Figure 5:
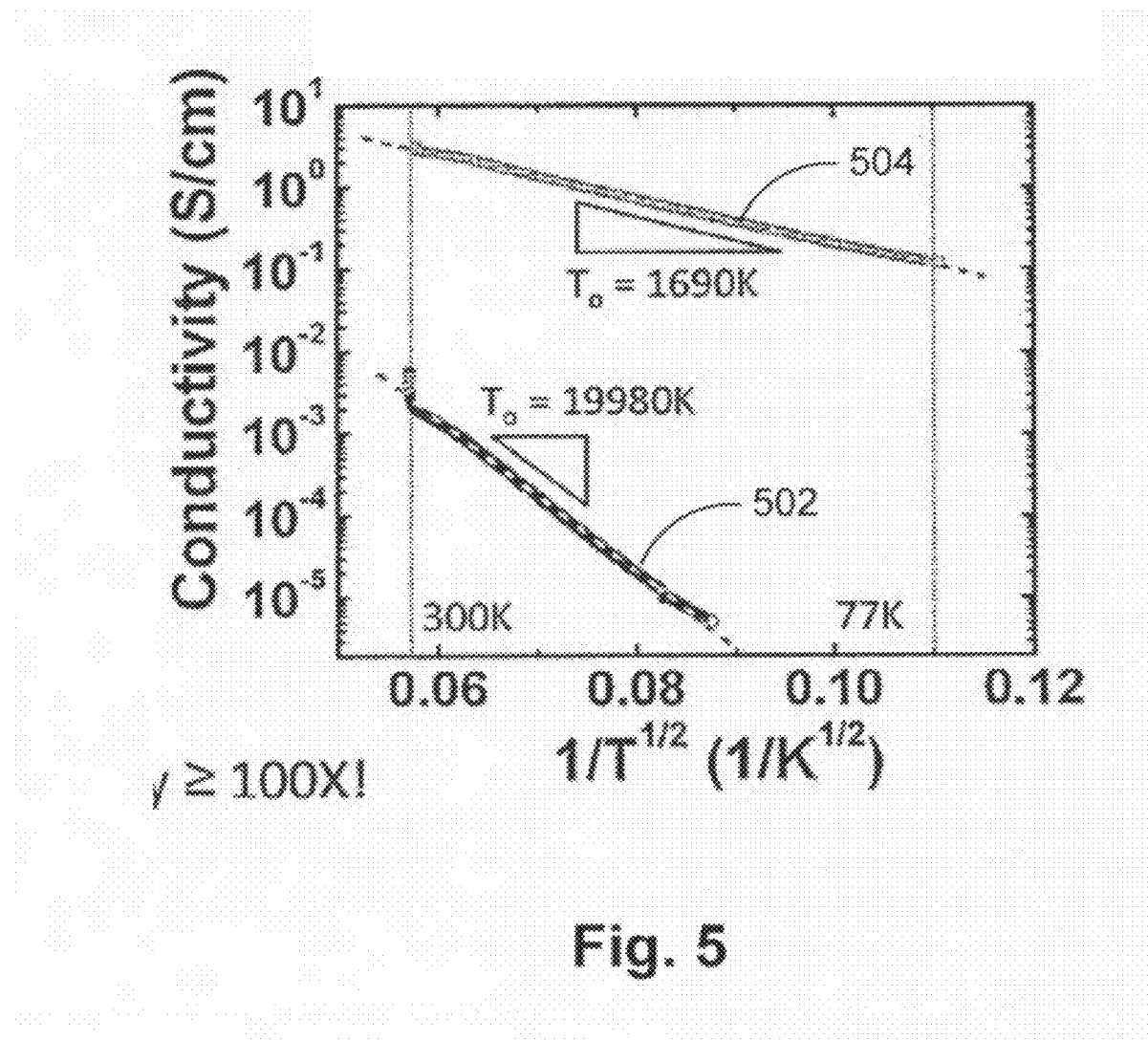
FIG. 5 illustrates the effect of post-processing treatment on variable temperature conductivity measurements of a conductive polymer film, according to one embodiment.

To understand the effect of post-processing treatment in the charge transport of a conductive polymer film, FIG. 5 depicts the results of variable temperature conductivity measurements performed on the untreated and treated films. Specifically, to derive FIG. 5, each of the untreated and treated films was placed in a cryostat and its conductivity was measured for different temperature between 81 K and 298 K (room temperature). In FIG. 5, graphs 502 and 504 shows the results for the untreated and treated films, respectively.

To derive the data in graph 502, the conductivity of the untreated film was measured using two-point probe technique—which is different from the four-point probe technique in that it employs two, not four, gold strip probes—because the conductivity of the untreated film at low temperatures was too low to be analyzed by a four-point probe setup. Since the bulk resistance of the untreated film was high, it was assumed that the contact resistance between the probes and the sample was negligible and the conductivity was calculated based on the dimensions of the setup given the output currents. No data was acquired below 130 K where the bulk resistance of untreated film exceeded the instrumental limitation. As seen in graph 502, the conductivity of the untreated film decreased from $10^{-2}$ S/cm at 298K (upper left corner of graph 502) to $10^{-6}$ S/cm at 130K (lower right corner of 502). This graph indicates that the untreated film behaves more like a semiconductor than a metal, for which, at low temperatures, the scattering decreases and thus the conductivity increases with decreasing temperature. The conductivity data in graph 502 can be described by an Arrhenius fit, suggesting that charge transport in the untreated film is enabled by a thermally activated hopping process.

To derive the data in graph 504, the conductivity of the treated film was measured using a four-point probe. Similar to that of the treated film, the conductivity decreases as the temperature is decreased, suggesting that charge transport in the treated film is also enabled by a thermally-activated hopping process. Both graphs 502 and 504 show a linear behavior and were fit with the quasi one-dimensional variable hopping model shown in Equation (1) below $$\sigma(T) = \sigma_o \exp\left[-\left(\frac{T_o}{T}\right)^{1/2}\right]$$

in which $\sigma$ is the conductivity; $\sigma_0$ is a constant; T is the temperature; and $T_0$ is the slope of the conductivity-temperature curve shown in each graph 502 and 504, and can be thought of as an activation energy for charge hopping. Fitting the data in graphs 502 and 504 to Equation (1) reveals that for the untreated film of graph 502, $T_0$ is 19980K, while for the treated film of graph 504, $T_0$ is 1690K. Therefore, $T_0$, representing the activation energy for charge hopping, decreases more than ten times as a result of post-processing treatment, resulting in a drastic increase in the conductivity of the film.

Figure 6:
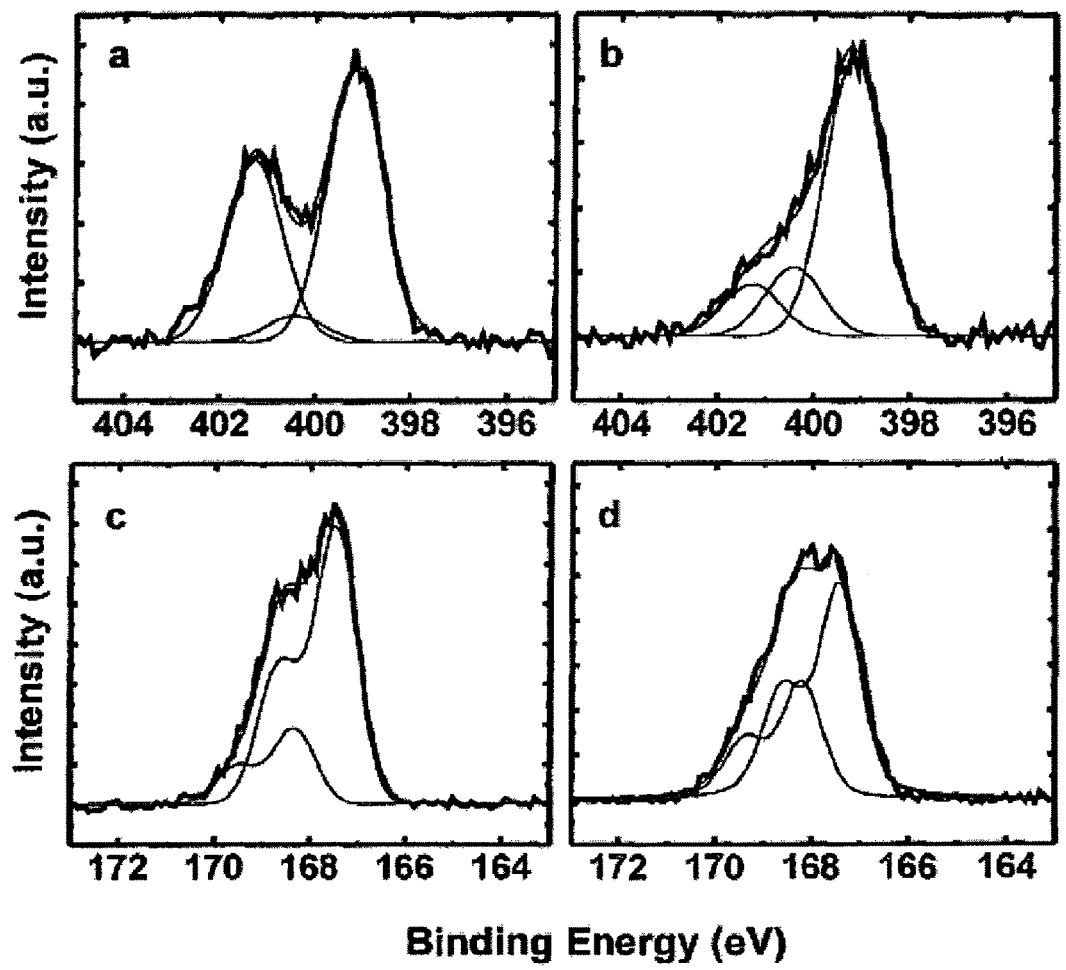
FIG. 6 illustrates the effect of post-processing treatment on the X-ray photoemission spectroscopy of a conducive polymer film, according to one embodiment.

To further examine the chemical changes in the conductive polymer film as a result of post-processing treatment according to an embodiment, X-ray photoemission spectroscopy (XPS) experiments were conducted on the untreated and treated films discussed above, and their results are shown in FIG. 6. XPS spectra were collected at a take-off angle of 75° to increase the depth sensitivity of the films. FIGS. 6a and 6b show the XPS nitrogen spectra untreated and treated films, respectively. The nitrogen spectra were deconvoluted into three Gaussian peaks centered at 399.2 eV (NH, nitrogen in amines), 400 AeV ($N^{1+}$, protonated nitrogen), and 401.3 eV ($N^{2+}$, protonated nitrogen). A full width half maximum intensity (FWHM) of 1.4 eV is maintained for all three peaks. FIGS. 6c and 6d show the XPS sulfur spectra of the untreated and treated films, respectively. The sulfur spectra were deconvoluted into two doublets. Each doublet was fitted with two singlets, i.e., $S2p_{3/2}$ and $S2p_{1/2}$. One doublet was fitted with two singlets, $S2p_{3/2}$ and $S2p_{1/2}$ that are centered at 167.5 ev and 168.7 eV, respectively (ionized PAAMPSA, SO3-N+) and the other doublet with $S2p_{3/2}$ and $S2p_{1/2}$ that are centered at 168.3 ev and 169.5 eV, respectively (neutral PAAMPSA, $SO_3H$). All four singlet peaks maintain a FWHM of 1.0 eV. No measurable amounts of chlorine was detected in the treated film, suggesting that DCA was completely removed from the treated film as a result of heating the film in step 106.

To quantify the changes in the concentration of nitrogen and sulfur atoms in neutral and ionic environments, it was first assumed that the concentration of total sulfur atoms in the system (only PAAMPSA contains sulfur) remains constant before and after DCA treatment since PAAMPSA is not volatile. It was further assumed that the nitrogen in PAAMPSA is neutral. The peak associated with these neutral nitrogen atoms is difficult to decouple from any neutral nitrogens in PANI because they overlap. Also, the intensities of neutral amine nitrogens of PANI-PAAMPSA, (NH, 399.2 eV) were integrated with that of protonated nitrogens ($N^{1+}$, 400 AeV and $N^{2+}$, 401.3 eV) in PANI, that of the neutral sulfurs in PAAMPSA ($SO_3H$, $S2p_{3/2}$ at 168.3 eV), and that of sulfurs in ionized sulfonic acid ($SO_3^-N^+$, $S2p_{3/2}$ at 167.5 eV) in PAAMPSA. These integrated intensities are normalized by the total concentration of sulfur atoms (S).

In these studies, $N^{1+}$ is identified to be associated with delocalized polarons and bipolarons that enable charge transport through PANI-PAAMPSA. $N^{2+}$ is identified as the positively charged amines that are more tightly bound to the ionized sulfonic groups in PAAMPSA compared to $N^{1+}$. Before treating PANI-PAAMPSA with DCA, it was found that NH/S, $N^{1+}$/S and $N^{2+}$/S were respectively 1.08, 0.1, and 0.73. These observations indicate that a large portion of protonated nitrogens is strongly associated with negatively charged sulfonic acids groups in PAAMPSA. Consistent with these observations, a large portion of sulfonic acid was observed to be ionized, that is 0.79 of $SO_3^-N^+$/S as opposed to 0.21 of $SO_3H$/S. A low portion of $N^{1+}$/S that is relevant to charge transport is in agreement with a low electrical conductivity of PANI-PAAMPSA prior to post-processing treatment with DCA.

After post processing treatment, NH/S and $N^{1+}$/S, (401.3 eV) increased from 1.08 to 1.25 and 0.10 to 0.30, respectively, and $N^{2+}$/S decreased from 0.73 to 0.23. Simultaneously, the relative concentration of ionized sulfonic acid, $SO_3^-N^+$/S is also decreased from 0.79 to 0.65. These observations suggest that the strong ionic associations between PANI and PAAMPSA, i.e., $N^{2+}$/S and $SO_3^-N^+$/S are reduced with the post-processing treatment with DCA. As such, DCA "moderates" the ionic interactions between PANI and PAAMPSA, thereby allowing structural rearrangement of PANI-PAAMPSA. Specifically, PANI-PAAMPSA adopts an "extended chain" structure (as opposed to a "compact coil") after post-processing treatment with DCA. Such DCA-treated PANI-PAAMPSA having the "extended chain" structure exhibits higher conductivities.

Figure 7:
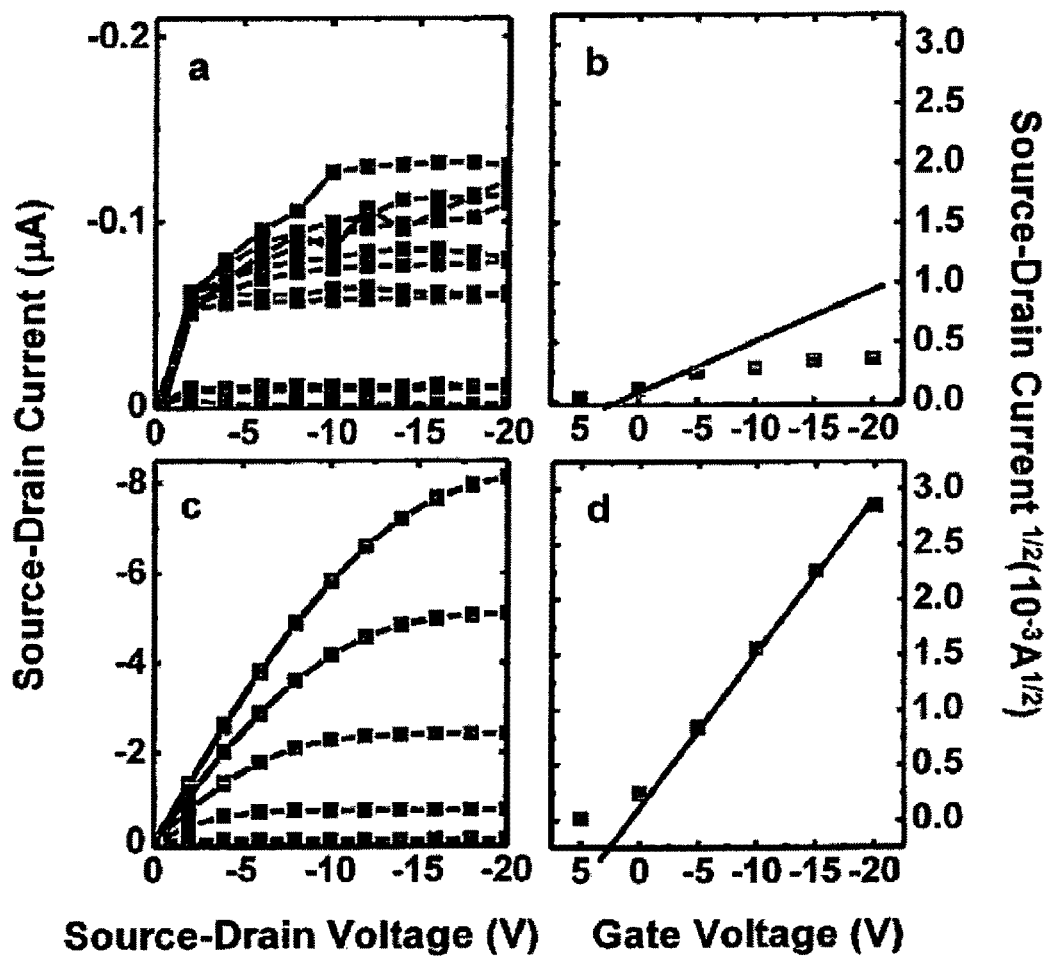
FIG. 7 illustrates the effect of post-processing treatment on the electrodes in a thin film transistor (TFT) made from conductive polymers, according to an embodiment.

FIG. 7 illustrates the effect of post-processing treatment on the electrodes in a thin film transistor (TFT) made from conductive polymers, according to an embodiment. More specifically, FIGS. 7a-7d show the behavior of source-drain current as a function source-drain voltage and also as a function of gate voltage for the untreated and treated films. FIG. 7a shows representative I-V characteristics of a DHT-ANT TFTs with untreated PANI-PAAMPSA electrode. This TFT exhibits significantly suppressed output currents and suffers from serious current hysteresis. The transfer characteristics also exhibit low source-drain currents with a roll-off at gate voltages higher than −5V, as shown in FIG. 7b. FIG. 7c reveals drastically enhanced I-V characteristics for a DHT-ANT TFT with DCA-treated PANI-PAAMPSA electrodes. The output currents increase by more than an order of magnitude, relative to those of devices with PANI-PAAMPSA electrodes. FIG. 7d shows that the transfer characteristics of the same device, in which the source-drain current is effectively modulated as a function of the gate voltage without any roll-off.

Figure 8A:
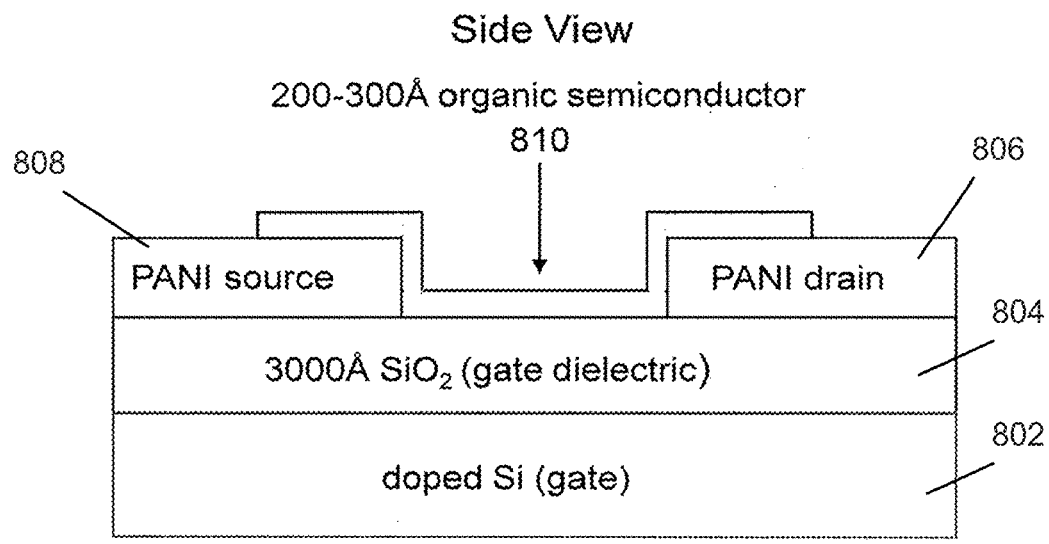
FIGS. 8A and 8B illustrates the design of a thin film transistor built using a conductive polymer film, according to an embodiment.
Figure 8B:
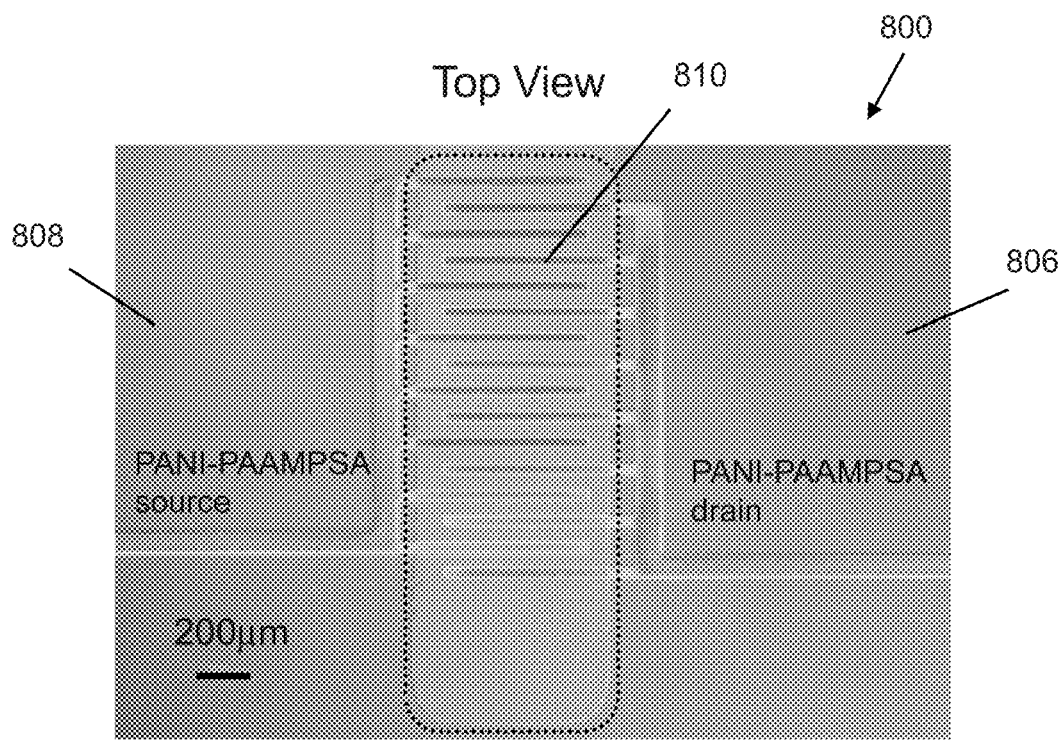

FIGS. 8A and 8B respectively show a side view and a top view of a semiconductor device 800 utilizing conductive polymer films, according to one embodiment. Device 800 includes an $SiO_2$ gate dielectric layer 804 formed over a doped Si gate layer 802. Further, device 800 includes drain area 806 and source area 808 over the gate dielectric layer 804. In some embodiments, drain and source areas 804 and 806 each include conductive polymer films. In one embodiment, the drain and source areas 806 and 808 are formed using a conductive polymer film including PANI doped with PAAMPSA. Moreover device 800 includes an organic semiconductor layer 810 formed over the drain and source areas 806 and 808, and gate dielectric layer 804.

FIGS. 9 and 10, illustrate the morphology of a conductive polymer film, before and after post-processing treatment, according to one embodiment. Specifically, FIG. 9 illustrates the surface morphology of a PANI-PAAMPSA film after preparation and before post-processing treatment. FIG. 10 illustrates the surface morphology of the same PANI-PAAMPSA film of FIG. 9 after post-processing treatment.

Figures 11A, 11B:
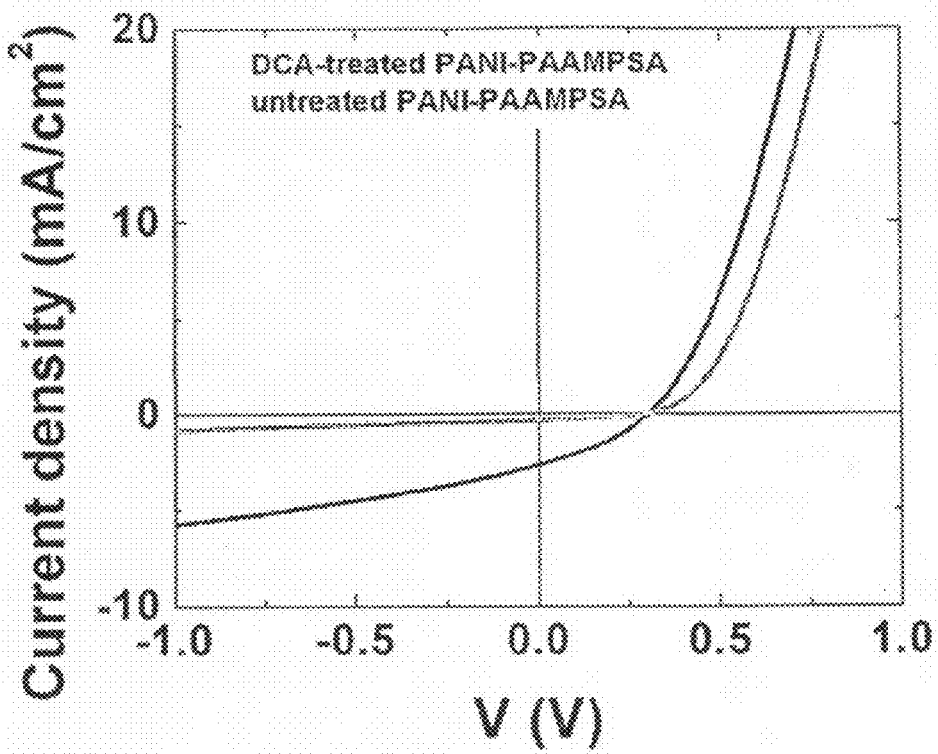
FIGS. 11A and 11B illustrate the current density-voltage characteristics of organic solar cells with post-processing treated and untreated conducting polymer electrodes.

FIG. 11A shows the JV characteristics of organic solar cells in which untreated and treated conducting polymer films were used as anodes in place of transparent metal oxide. The relevant figures of merit are summarized in FIG. 11B. The use of treated conducting polymer instead of untreated conducting polymer dramatically decreases the internal series resistance of the device, effectively increasing short circuit current density and efficiency.

The following represents additional testing in accordance with embodiments within the scope of the present disclosure. PANI-PAAMPSA films on Si/SiO$_2$ substrates were prepared from a 5 wt % aqueous dispersion. The PANI-PAAMPSA films were baked at 90° C. for 3 minutes to remove residual water, and were subsequently immersed in pre-heated DCA (Acros Organics, 99+%) at 80° C. for 10 minutes. After being immersed in DCA with agitation, the substrates were baked at 90-100° C. for 10-15 minutes to remove residual DCA. The electrical conductivities of DCA-treated PANI-PAAMPSA films were then measured using the four-point probe technique described above. In addition, PANI-PAAMPSA films were treated with other solvents, such as trichloroacetic acid (TCA) and dimethyl sulfoxide (DMSO). The results from these four experiments are summarized below.

|  | Conductivity (S/cm) | Solvent acidity (pK$_a$) |
| --- | --- | --- |
| Untreated PAN-PAAMPSA | 0.16 ± 0.10 | — |
| DCA-treated PANI-PAAMPSA | 72 ± 43 | 1.3 |
| TCA-treated PANI-PAAMPSA | 64 ± 34 | 0.77 |
| DMSO-treated PANI-PAAMPSA | 0.20 ± 0.01 | 35 |

A thin-film-transistor can be made using PANI-PAAMPSA films described above, and having characteristics summarized in the following table

| Electrodes | Mobility (cm$^2$/V-sec) | on/off current |
| --- | --- | --- |
| Untreated PAN-PAAMPSA | 0.007 ± 0.03 | 10$^3$ |
| DCA-treated PANI-PAAMPSA | 0.07 ± 0.02 | 10$^5$ |

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for enhancing electrical conductivity of a film, the method comprising:
   providing an untreated film comprising a conductive polymer and a polymer acid, the untreated film having a first conductivity; and
   treating the untreated film by exposing the untreated film to a plasticizer reagent and heating the film to remove excess plasticizer reagent, the treated film having a second conductivity;
   wherein the plasticizer reagent comprises an acid that is stronger than the polymer acid, and wherein the second conductivity of the treated film is at least 100 times greater than the first conductivity of the untreated film.

2. The method of claim 1, further comprising agitating the untreated film in the plasticizer reagent.

3. The method of claim 1, wherein the conductive polymer is water dispersible.

4. The method of claim 1, further comprising preheating the plasticizer reagent to a first temperature and heating the film to a second temperature.

5. The method of claim 4, wherein the first temperature ranges from 80° C. to 120° C.

6. The method of claim 1, wherein the second temperature is below a glass transition temperature of the treated film.

7. The method of claim 1, wherein the heating step is performed for a time interval sufficient for the at least one reagent to diffuse through the conductive polymer film.

8. The method of claim 7, wherein the time interval is dependent on one or more of a thickness of the conductive polymer film, a temperature of the plasticizer reagent, and an extent of agitation of the plasticizer reagent.

9. The method of claim 1, wherein the heating step is performed for about thirty minutes.

10. The method of claim 1, wherein the heating step comprises placing the film on a heated surface.

11. The method of claim 1, wherein the plasticizer reagent is chosen from dichloroacetic acid and trichloroacetic acid.

12. The method of claim 1, wherein the conductive polymer is chosen from polyaniline and polyethylene dioxythiophene).

13. A method for enhancing carrier mobility of an electrode in an organic device, the method comprising:
   providing an untreated film comprising a conductive polymer and a polymer acid, the untreated film having a first carrier mobility; and
   treating the untreated film by exposing the untreated film to a plasticizer reagent and heating the film to remove excess plasticizer reagent, the treated film having a second carrier mobility;
   forming the electrode from the treated film, wherein the plasticizer reagent comprises an acid that is stronger than the polymer acid, and wherein the second carrier mobility of the treated film is at least 10 times greater than the first carrier mobility of the untreated film.

14. The method of claim 13, wherein the plasticizer reagent is chosen from dichloroacetic acid and trichloroacetic acid.

15. The method of claim 13, wherein the conductive polymer is chosen from polyaniline and poly(ethylene dioxythiophene).

16. The method of claim 13, wherein the device is a thin-film transistor.

17. A method for enhancing the on/off current ratio of an organic electronic device, the method comprising:
   providing an untreated film comprising a conductive polymer and a polymer acid, the untreated film having a first on/off current ratio; and
   treating the untreated film by exposing the untreated film to a plasticizer reagent and heating the film to remove excess plasticizer reagent, the treated film having a second on/off current ratio;
   forming the organic electronic device incorporating the treated film, wherein the plasticizer reagent comprises a reagent acid that is stronger than the polymer acid, and wherein the on/off current ratio of the organic electronic device comprising the treated film is at least 100 times greater than the on/off current ratio of an organic electronic device comprising the untreated film.

18. The method of claim 17, wherein the reagent is chosen from dichloroacetic acid and trichloroacetic acid.

19. The method of claim 18, wherein the conductive polymer is chosen from polyaniline and poly(ethylene dioxythiophene).

20. The method of claim 19, wherein the organic electronic device is a thin-film transistor.

* * * * *